(12) United States Patent
Borini et al.

(10) Patent No.: US 11,421,139 B2
(45) Date of Patent: Aug. 23, 2022

(54) HEAT SPREADER AND METHOD OF MANUFACTURE THEREOF

(71) Applicant: GRAPHITENE LTD., London (GB)

(72) Inventors: Stefano Borini, London (GB); Gaute Juliussen, London (GB); Paulauskas Mindaugas, London (GB)

(73) Assignee: GRAPHITENE LTD., London (GB)

( * ) Notice: Subject to any disclaimer, the term of this patent is extended or adjusted under 35 U.S.C. 154(b) by 247 days.

(21) Appl. No.: 16/617,095

(22) PCT Filed: May 28, 2018

(86) PCT No.: PCT/EP2018/063862
§ 371 (c)(1),
(2) Date: Nov. 26, 2019

(87) PCT Pub. No.: WO2018/215664
PCT Pub. Date: Nov. 29, 2018

(65) Prior Publication Data
US 2020/0165503 A1    May 28, 2020

(30) Foreign Application Priority Data
May 26, 2017 (GB) ..................... 1708518

(51) Int. Cl.
| | | |
|---|---|---|
| *B32B 9/00* | (2006.01) | |
| *C09K 5/14* | (2006.01) | |
| *C01B 32/184* | (2017.01) | |
| *C01B 32/194* | (2017.01) | |
| *C23C 16/02* | (2006.01) | |

(Continued)

(52) U.S. Cl.
CPC .............. *C09K 5/14* (2013.01); *C01B 32/184* (2017.08); *C01B 32/194* (2017.08); *C23C 16/0209* (2013.01); *C23C 16/0227* (2013.01); *C23C 16/26* (2013.01); *F28F 21/02* (2013.01); *F28F 21/089* (2013.01); *H05K 7/20509* (2013.01); *B82Y 30/00* (2013.01); *C01B 2204/24* (2013.01); *Y10T 428/30* (2015.01)

(58) Field of Classification Search
CPC ....... Y10T 428/30; B82Y 30/00; B82Y 40/00; B32B 9/007; C09K 5/14; C01B 32/184
USPC .......................... 428/408; 423/448; 165/185
See application file for complete search history.

(56) References Cited

U.S. PATENT DOCUMENTS

| | | |
|---|---|---|
| 2007/0063339 A1 | 3/2007 | Yao |
| 2007/0289730 A1 | 12/2007 | Wu |

(Continued)

FOREIGN PATENT DOCUMENTS

| | | |
|---|---|---|
| CN | 203032018 U | 7/2013 |

OTHER PUBLICATIONS

Han Haoxue et al: "Enhanced heat spreader based on few-layer graphene in intercalated with silane-functionalization molecules", Therminic 2014, 20th International Workshop on Thermal Investigations of ICS and Systems, IEEE, Sep. 24, 2014, ISBN 978 1-4799-5415-5; 4 Pages.

(Continued)

*Primary Examiner* — Daniel H Miller
(74) *Attorney, Agent, or Firm* — Ziegler IP Law Group, LLC

(57) ABSTRACT

A heat spreader. The heat spreader includes a copper substrate layer, and at least one layer of graphene deposited on the copper substrate layer.

11 Claims, 3 Drawing Sheets

(51) Int. Cl.
*C23C 16/26* (2006.01)
*F28F 21/02* (2006.01)
*F28F 21/08* (2006.01)
*H05K 7/20* (2006.01)
*B82Y 30/00* (2011.01)

(56) References Cited

U.S. PATENT DOCUMENTS

| 2012/0208008 | A1* | 8/2012 | Tour | C01B 32/18 |
| | | | | 428/336 |
| 2012/0282419 | A1* | 11/2012 | Ahn | H01L 51/5253 |
| | | | | 428/34.8 |
| 2014/0120270 | A1* | 5/2014 | Tour | C01B 32/186 |
| | | | | 427/596 |
| 2015/0313041 | A1 | 10/2015 | Wu et al. | |
| 2016/0370133 | A1 | 12/2016 | Liu et al. | |
| 2017/0115074 | A1 | 4/2017 | Cheng | |

OTHER PUBLICATIONS

International Search Report, Application No. PCT/EP2018/063862, dated Oct. 2, 2018, 3 pages.

\* cited by examiner

HEAT SPREADER AND METHOD OF MANUFACTURE THEREOF

TECHNICAL FIELD

The present disclosure relates generally to heat dissipation; and more specifically, to heat spreaders. Moreover, the present disclosure is concerned with methods of manufacturing aforesaid heat spreaders.

BACKGROUND

With advancements in electronic technologies, electronic devices are capable of executing high performance tasks at speeds which were unimaginable a few decades ago. Further with the development of microprocessors and microchips, the size of electronic device has been growing increasingly compact. Generally, such compact electronic devices comprise a tightly packed assembly of components such as processors, display screens, battery packs and so forth. Typically, in such a tightly packed assembly, heat generation in the electronic device may be significant.

Generally, in compact electronic devices, the components may be directly adjacent to external surface of the electronic device. Consequently, the external surface of the electronic device may experience high temperatures. Further, heat generation in the electronic device may hamper the overall experience of the device. Specifically, user may experience discomfort while operating the electronic device. Additionally, heat generation may pose a security risk and may affect the performance of the battery pack. Further, life expectancy of the electronic device may be significantly negatively affected by the high temperatures. In addition, the processors of the electronic device may be throttled, to reduce amount of power and avoid exceeding temperature limits, thereby reducing overall performance of the device.

Conventionally, heat spreaders and/or heat sink are used to dissipate heat generated in the electronic device. The heat spreader and/or heat sink may transfer heat energy from a device at relatively higher temperatures to a cooler environment, such as ambient air. Generally, heat spreaders employ a combination of graphite and/or carbon nano tubes (CNT) and a metal to dissipate heat. However, adhesion of graphite and/or carbon nano tubes (CNT) to surface of the metal is relatively poor. Further, solutions comprising binders may be employed to the surface to metal to improve its adhesion properties. However, use of binders may negatively affect thermal dissipation performance of the heat spreader.

Therefore, in light of the foregoing discussion, there exist problems associated with conventional heat spreaders.

SUMMARY

The present disclosure seeks to provide an improved heat spreader.

The present disclosure also seeks to provide an improved method of manufacturing a heat spreader.

According to a first aspect there is provided a heat spreader comprising:
   a copper substrate layer; and
   at least one layer of graphene deposited on the copper substrate layer.

The present disclosure seeks to provide an improved, efficient, light-weight heat spreader for heat dissipation; and moreover, employs graphene to provide higher mechanical robustness and thermal conductivity to the heat spreader.

Optionally, the at least one layer of graphene includes doped graphene.

Optionally, the at least one layer of graphene includes reduced graphene oxide.

More optionally, the at least one layer of graphene includes functionalised graphene.

Optionally, the functionalised graphene includes at least one of a functional group: aliphatic ester, aromatic ester, amine, epoxide, carboxyl, hydroxyl, siloxanes, silanes.

Optionally, thickness of the at least one layer of graphene is in a range of 0.1-50 micrometres.

Optionally, the at least one layer of graphene further includes a top layer of graphene.

More optionally, the top layer of graphene includes silane-functionalised graphene.

Optionally, thickness of the top layer of graphene (202) is in a range of 1-1000 nanometres.

Optionally, the copper substrate layer is treated using at least one of a technique: heating, annealing, washing.

According to a second aspect, there is provided a method of manufacturing a heat spreader, the method comprising:
   providing a copper substrate layer; and
   depositing at least one layer of graphene on the copper substrate layer.

Optionally, depositing the at least one layer of graphene includes arranging for the at least one layer of graphene to include doped graphene.

Optionally, depositing the at least one layer of graphene includes
   arranging for the at least one layer of graphene to include graphene oxide; and
   reducing the at least one layer of graphene oxide.

Optionally, depositing the at least one layer of graphene includes arranging for the at least one layer of graphene to include functionalised graphene.

More optionally, the method further includes arranging for the at least one layer of graphene to include a top layer of graphene.

Optionally, the method includes arranging for the top layer of graphene to include silane-functionalised graphene.

Optionally, the method includes treating the copper substrate layer using at least one of a technique: heating, annealing, washing.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In overview, embodiments of the present disclosure are concerned with improved heat spreaders for heat dissipation.

Figure 1:
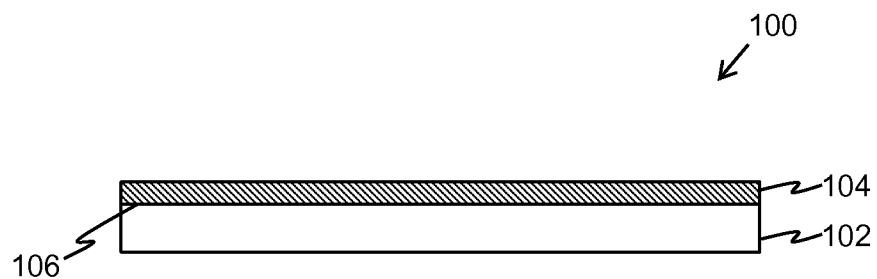
FIGS. 1-2 are schematic illustrations of a heat spreader, in accordance with different embodiments of the present disclosure.

Referring to FIG. 1, there is shown a schematic illustration of a heat spreader 100, in accordance with an embodiment of the present disclosure. As shown, the heat spreader 100 comprises a copper substrate layer 102 and at least one layer of graphene, such as the layer of graphene 104, deposited on the copper substrate layer 102. Specifically, the at least one layer of graphene 104 is deposited on the surface 106 of the copper substrate layer 102.

Optionally, graphene may be synthesised by one of the synthesis techniques: mechanical cleaving, chemical exfoliation, chemical synthesis or chemical vapour deposition. In an example, the synthesis technique employed to synthesise graphene may be mechanical cleaving. In such example, graphite or graphite oxide is mechanically cleaved to obtain graphene sheets. In another example, the graphene may be synthesized by chemical vapour deposition. In such example, methane and hydrogen are reacted on a metal surface at high temperatures to deposit sheets of graphene thereon. In yet another example, chemical synthesis may be employed to obtain graphene by synthesizing graphene oxide and subsequently reducing with hydrazine.

Optionally, the properties and structure of graphene may depend on the technique employed for synthesis. Specifically, the synthesised graphene may be a two-dimensional structure with hexagonal lattices. More specifically, the synthesised graphene may comprise carbon atoms on the vertices of the hexagonal lattice. Additionally, the chemical vapour deposition technique may be employed to obtain graphene sheets with least amount of impurities.

Optionally, the at least one layer of graphene, such as the layer of graphene 104, may include doped graphene. Specifically, synthesised graphene may be doped with an element to enhance properties of the synthesised graphene and improve interactability with the copper substrate layer. Examples of the element may include, but are not limited to, boron, sulphur, nitrogen, silicon. Optionally, graphene may be doped by employing a doping technique such as hetero atom doping, chemical modification, arc discharge and so forth.

Optionally, graphene may be doped with nitrogen by employing chemical modification. Specifically, graphene may be chemically modified by nitrogen-containing compounds such as nitrogen dioxide, ammonia and so forth. More optionally, graphene doped with an element may be obtained by employing arc discharge of graphite electrodes in presence of a gas and a compound containing the element to be doped. In an example, boron doped graphene may be obtained by arc discharge of graphite electrodes in presence of a gas such as hydrogen or helium, and a compound containing boron such as diborane. In another example, nitrogen doped graphene may be obtained by arc discharge of graphite electrodes in presence of a gas such as hydrogen or helium, and a compound containing nitrogen such as ammonia or pyridine.

Optionally, graphene 104 may be doped with nitrogen and the layer of doped graphene thus obtained may be deposited directly on the copper substrate layer 102 by employing low pressure chemical vapour deposition method from methane with either Carbon 12 or Carbon 13 isotope. More optionally the graphene doped with an element may be obtained by employing arc discharge of graphite electrodes in presence of a gas and a compound containing the element to be doped, wherein, the arc discharge is performed in an electric arc oven which includes a cathode and an anode and both pure graphite rods. Specifically, the current in the discharge process is maintained at 100-150 A. Moreover, the atmospheres for arc evaporation of graphite rods are H2, NH3 and He, air. Therefore, the heat spreader thus formed comprises a copper substrate layer 102, and at least one layer of graphene deposited on the copper substrate layer 102, wherein the at least one layer of graphene includes doped graphene.

It will be appreciated that the doped graphene may exhibit superior adhesion properties with the copper substrate layer in comparison with the synthesised graphene solely comprising carbon atoms. Furthermore, the element introduced in the two-dimensional structure of graphene may interact with the copper substrate layer. Examples of the interaction may include Vander-Walls interactions, Pi-interactions and so forth. Subsequently, such interactions may enhance adhesion of doped graphene on the surface of the copper substrate layer, such as the surface 106 of the copper substrate layer 102.

Optionally, the at least one layer of graphene, such as the layer of graphene 104, may include functionalised graphene. More optionally, the functionalised graphene may include at least one of a functional group: aliphatic ester, aromatic ester, amine, epoxide, carboxyl, hydroxyl, siloxanes, silanes. Furthermore, the synthesized graphene may be reacted with a suitable compound to obtain functionalised graphene. Optionally, graphene could be non-covalently functionalised by mixing graphene with organic molecules such as polymers. In an example, a water solution processing method can be used for the preparation of polyvinyl alcohol (PVA) nanocomposites with graphene oxide (GO).

Optionally, each of the carbon atoms in the synthesised graphene comprises a delocalised electron. Consequently, the functional group may react with the carbon atoms thereof. In an example, the functionalised graphene may include functional groups, epoxide and carboxylic acid. In addition, the functional groups of the functionalised graphene may influence the properties thereof. Furthermore, the functional groups of the functionalised graphene may enhance adhesion of doped graphene on the surface of the copper substrate layer, such as the surface 106 of the copper substrate layer 102. Additionally, the functionalised graphene may exhibit superior thermal conductivity, when contacted with a heat source in comparison with the synthesised graphene solely comprising carbon atoms.

Optionally, the at least one layer of graphene, such as the layer of graphene 104 deposited on the copper substrate layer 102, may include reduced graphene oxide. More optionally, depositing the at least one layer of graphene may include arranging for the at least one layer of graphene to include graphene oxide. Specifically, graphene oxide may be arranged by the exfoliation of graphite oxide. More specifically, the graphite may be oxidized by reaction with strong oxidising agents such as sulphuric acid, potassium permanganate and sodium nitrate. Subsequently, the oxidised graphite may be dispersed in a solution such as water. Specifically, the oxidised graphite may be dispersed in water to further increase inter-planar spacing between layers of graphene in graphite oxide.

Optionally, the at least one layer of graphene may be a combination of oxidised and non-oxidised graphene flakes. In one example, exfoliated graphene flakes may be mixed with graphene oxide flakes, to provide dispersibility in water-based solution and improved adhesion to Cu substrates and thermal spreading performance. In one example, the ratio between graphene and graphene oxide within the at least one layer of graphene could be 1:1.

Optionally, depositing the at least one layer of graphene may include reducing the at least one layer of graphene oxide. Specifically, reduction of graphene oxide may be arranged by employing chemical, electrochemical or thermal means. In an example, the reduction of graphene oxide may be arranged by employing chemical means. In such example, graphene oxide may be heated in distilled water at high temperatures. Alternatively in such example, graphene oxide may be reacted with a reducing agent such as urea, hydrazine, ascorbic acid or others. In another example, the reduction of graphene oxide may be arranged by employing thermal means. In such example, graphene oxide may be reduced at high temperatures in a range of 1000°-1200° Celsius. In another example, graphene oxide may be partially reduced upon heating at milder temperatures in a range of 150°-300° Celsius. In an example, the reduction could occur in controlled atmosphere, either in vacuum or in inert gas. Furthermore, reduction of graphene oxide may be arranged after deposition of graphene oxide on the copper substrate layer. Consequently, thermal reduction of graphene oxide may increase mechanical stability and interactability thereof with the copper substrate layer.

Optionally, the at least one layer of graphene, such as the layer of graphene 104, may be deposited directly on the copper substrate layer 102 by employing chemical vapour deposition methods. More optionally, the copper substrate layer 102 may be treated prior to deposition of the at least one layer of graphene thereon. Subsequently, a pre-calculated ratio of a hydrocarbon and hydrogen gas may be introduced over the copper substrate layer 102 in controlled temperature and pressure conditions. Furthermore, methane as a hydrocarbon gas may be preferred over hydrocarbon gases such as propane or butane. Specifically, methane as a hydrocarbon gas may be preferred because of low carbon to hydrogen ratio present therein.

Figure 2:
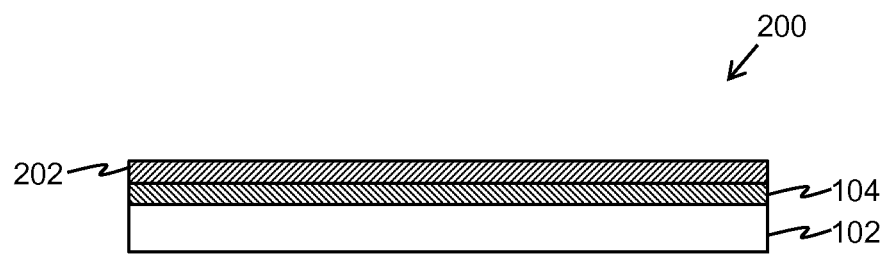

Referring to FIG. 2, there is shown a schematic illustration of a heat spreader 200, in accordance with another embodiment of the present disclosure. As shown, the heat spreader 200 comprises a copper substrate layer 102 and at least one layer of graphene, such as the layer of graphene 104 and a top layer of graphene 202, deposited on the copper substrate layer 102. Optionally, the at least one layer of graphene may include the top layer of graphene 202. In an example, the thickness of the at least one layer of graphene would be in the range of 0.1-50 micrometres.

Optionally, the top layer of graphene may be deposited on the layer of graphene 104. More optionally, the top layer of graphene 202 may be in direct contact with the heat source. Furthermore, the layer of graphene 102 may be selected based on the adhesion properties thereof with the copper substrate layer 102. In addition, the top layer of graphene 202 may be selected based on the thermal conductivity properties thereof.

Optionally, the top layer of graphene 202 may include silane-functionalised graphene. Specifically, synthesised graphene may be functionalised with a silane functional group. More specifically, the synthesised graphene may be treated with a silane-containing compound such as trimethoxysilane, triethoxysilane and so forth. Furthermore, silane-functionalised graphene may exhibit superior thermal conductivity.

In another example, the top layer of graphene may be a graphene-based nano-composite where graphene flakes are decorated with metal-containing particles. In an example, metal could be Aluminium.

In one example, the top layer could be a thin coating with thickness in the range of 1-1000 nanometres.

Optionally, the copper substrate layer 102 is treated using at least one of a technique: heating, annealing, washing. More optionally, the substrate 102 may be treated to further improve its physical properties and ensure adhesion of the deposited layer of graphene 104 thereon. In an example, the substrate may be washed prior to deposition of layer of graphene 104 thereon. Specifically in such example, the substrate may be washed with chemical compound to remove any undesirable elements present on the surface thereof.

Optionally, the copper substrate layer 102 may be annealed prior to deposition of at least one layer of graphene thereon. More optionally, the copper substrate layer 102 may be annealed at high temperatures. Furthermore, the copper substrate layer 102 may be annealed in a hydrogen reducing atmosphere. Additionally, the copper substrate layer 102 may be annealed to increase grain size thereof and rearrange surface morphology to facilitate adhesion of the at least one layer of graphene.

Optionally, thermal conductive properties of the heat spreader 100 may be evident from thermal imaging processes. Specifically, the thermal imaging process is an infrared thermal imaging technique. More specifically, the infrared thermal imaging technique measures, infrared radiations emitted by an object, such as the heat spreader 100, via a photo detector to generate a thermal image (or a thermogram). Furthermore, the thermal image provides an estimation of heat distribution in the object. Consequently, a thermal image of the heat spreader 100, comprising at least one layer of graphene 104 deposited on the copper substrate 102, indicates a uniform heat distribution thereon, elucidating high thermal conductivity thereof. In comparison, a thermal image of an uncoated copper substrate may indicate insignificant thermal conductivity thereof.

Figure 3:
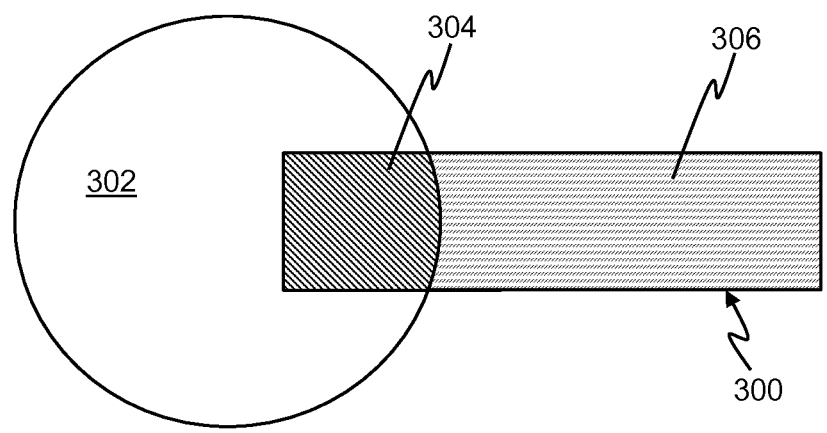
FIG. 3 is a schematic illustration of a thermal image of the heat spreader, in accordance with an embodiment of the present disclosure.

Referring to FIG. 3, there is shown a schematic illustration of a thermal image of the heat spreader 300 (such as the heat spreader 100 of FIG. 1), in accordance with an embodiment of the present disclosure. As shown, the heat spreader 300 is arranged to be in contact with a heating medium 302 (for example, a heating plate). Specifically, a portion 304 of the heat spreader 300 is arranged to be in contact with the heating medium 302. In an exemplary embodiment, temperature of the heating medium 302 may be in a range of 90°-120° Celsius. In such embodiment, the portion 304 of the heat spreader 300 corresponds to a uniform temperature range of 20°-45° Celsius. Subsequently, a portion 306 of the heat spreader 300 corresponds to a uniform temperature range of 10°-25° Celsius.

It will be appreciated from the temperature ranges of the heating medium 302 and the portions 304 and 306, that the heat spreader 300 exhibits substantial heat dissipation. Furthermore, the heat spreader 300 provides uniform heat distribution and improved thermal conductivity.

Figure 4:
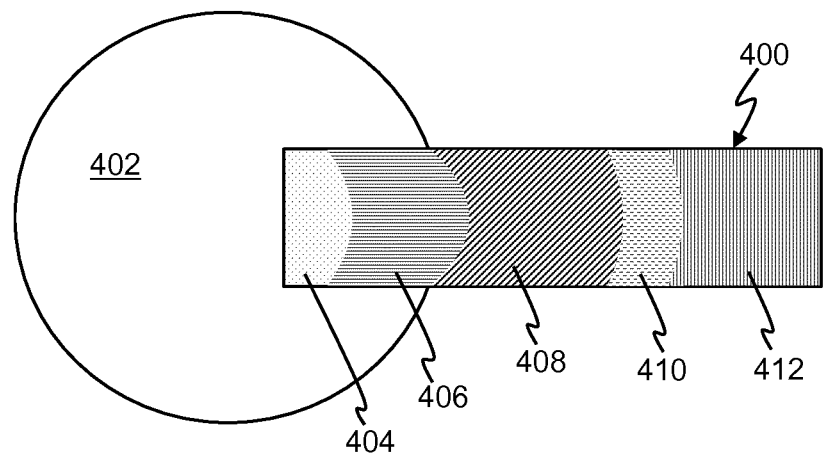
FIG. 4 is a schematic illustration of a thermal image of an uncoated copper substrate, in accordance with an embodiment of the present disclosure.

Referring to FIG. 4, there is shown a schematic illustration of a thermal image of an uncoated copper substrate 400, in accordance with an embodiment of the present disclosure. The uncoated copper substrate 400 is arranged to be in contact with the heating medium 402 (such as the heating medium 302 of FIG. 3). As shown, the uncoated copper substrate 400 when contacted with the heating medium 402 develops multiple temperature zones, such as the temperature zones 404, 406, 408, 410, 412.

In an exemplary embodiment, temperature of the heating medium 402 may be in a range of 50°-60° Celsius. In such embodiment, the temperature zone 404 exhibits substantially similar temperatures in a range of 50°-55° Celsius. Subsequently, the temperature zones 406 and 408 correspond to a temperature range of 40°-50° Celsius and 30°-40° Celsius, respectively. Furthermore in such embodiment, the temperature zones 410 and 412 correspond to a temperature range of 25°-30° Celsius and 15°-25° Celsius, respectively.

It will be appreciated from the FIG. 4 that the uncoated copper substrate 400 provides insignificant heat dissipation. Furthermore, the development of multiple temperature zones in the uncoated copper substrate 400 indicates a non-uniform heat distribution and poor thermal conductivity thereof.

Figure 5:
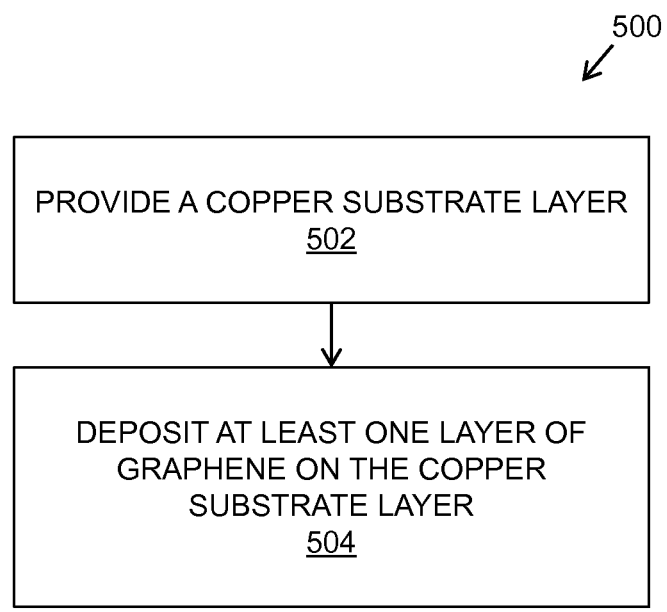
FIG. 5 is an illustration of steps of a method for manufacturing heat spreader, in accordance with an embodiment of the present disclosure.

Referring to FIG. 5, there is shown an illustration of steps of a method 500 for manufacturing a heat spreader, in accordance with an embodiment of the present disclosure. At a step 502, a copper substrate layer is provided. At a step 504, at least one layer of graphene is deposited on the copper substrate layer.

The steps 502 to 504 are only illustrative and other alternatives can also be provided where one or more steps are added, one or more steps are removed, or one or more steps are provided in a different sequence without departing from the scope of the claims herein. Optionally, depositing the at least one layer of graphene may include arranging for the at least one layer of graphene to include doped graphene. Optionally, depositing the at least one layer of graphene may include arranging for the at least one layer of graphene to include functionalised graphene.

More optionally, the method further may include arranging for the at least one layer of graphene to include a top layer of graphene. Optionally, the method includes arranging for the top layer of graphene to include silane-functionalised graphene. Optionally, the method includes treating the copper substrate layer using at least one of a technique: heating, annealing, washing.

The heat spreader of the present disclosure provides many benefits and enhances heat dissipation. The heat spreader employs graphene deposited on a copper substrate. Furthermore, the present disclosure provides manufacturing methods that eliminate the need of binders for deposition of graphene on the copper substrate. Beneficially, thermal conductivity of the heat spreader is superior in comparison with conventional heat spreaders. Additionally, the heat spreader ensures the temperatures do not exceed threshold limits. Beneficially, life expectancy and reliability of the device employing the heat spreader is significantly improved. Furthermore, the heat spreader is mechanically robust and highly efficient. In addition, the heat spreader of the present disclosure is structurally compact and may be compatible with compact electronic devices. Beneficially, the device employing the heat spreader may have an increased endurance and may be employed in extreme environments. Moreover, processors of a device employing the heat spreader may not be throttled to decrease temperatures, thereby improving performance of the device. Furthermore, improved strength and conductivity provided by the at least one layer of graphene may reduce requirement of copper in a heat spreader. Beneficially, weight of the device employing the heat spreader may be substantially reduced.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A heat spreader comprising:
   a copper substrate layer; and
   at least one layer of graphene deposited on the copper substrate layer, wherein the at least one layer of graphene comprises non-oxidised graphene and oxidised graphene, wherein the at least one layer of graphene includes thermally reduced graphene oxide, and wherein the at least one layer of graphene further comprises a top layer of silane-functionalised graphene.

2. The heat spreader of claim 1, wherein the at least one layer of graphene includes doped graphene.

3. The heat spreader of claim 1, wherein the at least one layer of graphene includes functionalised graphene.

4. The heat spreader of claim 3, wherein the functionalised graphene includes at least one of a functional group: aliphatic ester, aromatic ester, amine, epoxide, carboxyl, hydroxyl, siloxanes, silanes.

5. The heat spreader of claim 1 wherein a thickness of the at least one layer of graphene is in a range of 0.1-50 micrometres.

6. The heat spreader of claim 1, wherein a thickness of the top layer of silane-functionalised graphene is in a range of 1-1000 nanometres.

7. The heat spreader of claim 1, wherein the copper substrate layer is treated using at least one of a technique: heating, annealing, washing.

8. A method of manufacturing a heat spreader, the method comprising:
   providing a copper substrate layer; and
   depositing at least one layer of graphene on the copper substrate layer, wherein the at least one layer of graphene comprises non-oxidised graphene and oxidised graphene, wherein the at least one layer of graphene includes thermally reduced graphene oxide, and wherein the at least one layer of graphene further comprises a top layer of silane-functionalised graphene.

9. The method of claim 8, wherein depositing the at least one layer of graphene includes arranging for the at least one layer of graphene to include doped graphene.

10. The method of claim 8, wherein depositing the at least one layer of graphene includes arranging for the at least one layer of graphene to include functionalised graphene.

11. The method of claim 8, wherein the method includes treating the copper substrate layer using at least one of a technique: heating, annealing, washing.

* * * * *